US007469204B2

(12) United States Patent
Brooks et al.

(10) Patent No.: US 7,469,204 B2
(45) Date of Patent: Dec. 23, 2008

(54) METHOD AND APPARATUS FOR CALCULATING VOLTAGE DROP

(75) Inventors: Jeff Brooks, Ashburnham, MA (US); Haluk Akbudak, Boston, MA (US); Mark Barrieau, Baldwinville, MA (US); Kenneth Savage, Fitchburg, MA (US)

(73) Assignee: SimplexGrinnell LP, Westminster, MA (US)

( * ) Notice: Subject to any disclaimer, the term of this patent is extended or adjusted under 35 U.S.C. 154(b) by 196 days.

(21) Appl. No.: 11/340,979

(22) Filed: Jan. 27, 2006

(65) Prior Publication Data

US 2007/0179722 A1    Aug. 2, 2007

(51) Int. Cl.
    *G06F 17/50*    (2006.01)
(52) U.S. Cl. .......................... 703/18; 702/63; 340/506; 340/515
(58) Field of Classification Search .................. 703/14, 703/18; 702/60, 63; 340/506–508, 515; 307/66
    See application file for complete search history.

(56) References Cited

U.S. PATENT DOCUMENTS

| | | | | |
|---|---|---|---|---|
| 3,795,818 A | * | 3/1974 | Beaman et al. .............. 307/66 |
| 4,199,754 A | * | 4/1980 | Johnson et al. ............. 340/577 |
| 4,204,201 A | * | 5/1980 | Williams et al. ............ 340/521 |
| 4,255,746 A | * | 3/1981 | Johnson et al. ............. 340/577 |
| 4,435,700 A | * | 3/1984 | Alley ......................... 340/508 |
| 6,502,044 B1 | * | 12/2002 | Lane et al. .................... 702/63 |
| 6,992,575 B2 | | 1/2006 | Reghetti et al. |
| 7,180,411 B2 | | 2/2007 | Reghetti et al. |
| 2007/0115111 A1 | * | 5/2007 | Girouard ..................... 340/507 |

OTHER PUBLICATIONS

Lai et al., J.-S. High Energy Density Double-Layer Capacitors for Energy Storage Applications, IEEE, Aerospace and electronic Systems Magazine, Apr. 1992, pp. 14-19.*
Bhatt et al., M. A New Approach to Intermittent Charging of Valve-Regulated Lead-Acid Batteries in Standby Applications, IEEE Transactions on Industrial Electronics, Oct. 2005, pp. 1337-1342.*
Bhatt et al., M. A New Approach to Intermittent Charging of Valve-Regulated Lead-Acid Batteries in Standby Applications, 2003 IEEE 34th Annual Power Electronics Specialist Conference, Jun. 2003, pp. 895-900.*

* cited by examiner

*Primary Examiner*—Russell Frejd
(74) *Attorney, Agent, or Firm*—The Small Patent Law Group (57) ABSTRACT

A method for performing voltage drop calculations in an alarm circuit comprises creating a circuit to be controlled. A first device is selected from a list of devices to add to the circuit. An estimated power supply of the first device is calculated using modified nodal analysis of the circuit and it is determined whether the estimated power supply of the first device is sufficient power for the first device to operate.

21 Claims, 11 Drawing Sheets

The above Circuit can be Modeled as the Following:

FIG. 11

The Kirchoff's Equations:

$$260 \begin{cases} \text{SLC Voltage} = V1 \\ \text{Voltage @ Address 1} = V2 \\ \text{Voltage @ Address 2} = V3 \\ V1 = 19 \text{ V} \\ Is + 1/R1 * V1 - 1/R1 * V2 = 0 \\ -1/R1 * V1 + (1/R1 + 1/R2) * V2 - 1/R2 * V3 + I2 = 0 \\ -1/R2 * V2 + 1/R2 * V3 + I3 = 0 \\ a * V2 + b * I2 = c \\ d * V3 + e * I3 = f \end{cases}$$

$$262 \begin{cases} \begin{vmatrix} 1/R1 & -1/R1 & 0 & 1 & 0 & 0 \\ -1/R1 & 1/R1+1/R2 & -1/R2 & 0 & 1 & 0 \\ 0 & -1/R2 & 1/R2 & 0 & 0 & 1 \\ 1 & 0 & 0 & 0 & 0 & 0 \\ 0 & a & 0 & 0 & b & 0 \\ 0 & 0 & d & 0 & 0 & e \end{vmatrix} \begin{vmatrix} V1 \\ V2 \\ V3 \\ Is \\ I2 \\ I3 \end{vmatrix} = \begin{vmatrix} 0 \\ 0 \\ 0 \\ 19 \\ c \\ f \end{vmatrix} \end{cases}$$

FIG. 12

NAC Summary — 250

252 — Selected NAC - Results | Selected NAC-BOM | Project BOM

| Address | Part Number | Location | Voltage (V) | Current (A) |
|---------|-------------|----------|-------------|-------------|
| 1 | 4903-9450 | Annex Building | 19 | 0.741 |
|   |   | Lobby | 18.58 | 0.089 |
|   | Tap | Electrical Room 100 | 18.33 | 0 |
| 2 | 4903-9452 | Room 101 | 18.2 | 0.225 |
| 3 | 4903-9455 | Room 102 | 18.2 | 0.225 |
| 4 | 4903-9451 | Corridor | 18.47 | 0.202 |

FIG. 13

NAC Summary — 250

Selected NAC - Results | Selected NAC-BOM (256) | Project BOM (254)

| Qty | Part Number | Description |
|-----|-------------|-------------|
| 1 | 4903-9450 | 15cd A/V Wall Mount - Red |
| 1 | 4903-9452 | 110cd A/V Wall Mount - Red |
| 1 | 4903-9455 | 110cd A/V Wall Mount - White |
| 1 | 4903-9451 | 75cd A/V Wall Mount - Red |

FIG. 14

METHOD AND APPARATUS FOR CALCULATING VOLTAGE DROP

BACKGROUND OF THE INVENTION

This invention relates generally to fire alarm systems, and more particularly, to methods and apparatus for calculating power conditions at devices prior to installation.

In general, alarm systems include several notification appliances that are joined to common power lines extending from a control panel. Notification appliances may be wired as notification circuits by routing the wiring from the control panel to each device in succession. Alternatively, when wired as signaling lines, the wires may spoke off to form multiple wiring runs or branches. Forming branches in signaling line circuits is also referred to as "T-Tapping".

Notification appliances have one or more alarm indicators (e.g., strobes and horns) to notify people in the area of an alarm condition. Each notification appliance has a power operating range within which the device operates. A predefined or predetermined power (e.g., voltage and current) operating range may be set by a manufacturer or a regulatory body such as Underwriters Laboratories (UL). Different types of notification devices may have different voltage and/or current operating ranges. If the voltage is below the operating range, the appliance may not operate properly, producing visible signal intensities or sound pressure levels below the levels of the designed system.

Under normal operating conditions, an AC power provides a primary source of power to the control panel. A secondary source of power, such as storage batteries, is typically available. Fire alarm codes, such as NFPA 72, require that the system be operable for a minimum period of time when using the secondary power source, such as 24 hours, 60 hours or other length of time specified by the Authority Having Jurisdiction (AHJ). As the batteries are discharged, the output voltage supplied to the notification appliances decreases. Therefore, the system is required to operate with the power source at less than the rated input voltage, such as 85% of the rated input voltage.

Many of the notification appliances in use are "constant power" loads. When input voltage is reduced, the current increases, and thus the current draw of a notification appliance at reduced voltage is higher than when at the normal operating voltage. The increase in current draw at lower voltages also results in greater line loss than when operating under normal conditions.

Prior to installation, voltage drop calculations are obtained for the alarm system. Calculating actual voltage drop for appliances is extremely difficult, especially for T-Tapped circuits. Therefore, T-Tapped circuits are limited to known distances and the circuit is considered as a single line during calculations. A lump sum calculation is done for each wiring run to calculate the worst-case voltage drop based on low-battery operation. This method often results in severely limiting wiring distance, which is undesirable.

Therefore, a need exists for an automated method for calculating the voltage drop of appliances and other devices installed on single and multi-branch circuits. Certain embodiments of the present invention are intended to meet these needs and other objectives that will become apparent from the description and drawings set forth below.

BRIEF DESCRIPTION OF THE INVENTION

In one embodiment, a method for performing voltage drop calculations in an alarm circuit is provided. A circuit to be controlled is created and a first device is selected from a list of devices to add to the circuit. An estimated power supply of the first device is calculated using modified nodal analysis of the circuit, and the method determines whether the estimated power supply of the first device is sufficient power for the first device to operate.

In another embodiment, a graphical interface tool for calculating voltage drop in a circuit is provided. A circuit to be controlled is created and a controller is selected from a list of controllers displayed on a monitor. The controller controls the circuit and receives power from a power source. The controller has a worst-case voltage based on the power source. A first device is selected from a list of devices displayed on the monitor to add to the circuit and a first voltage of the first device is calculated based on the worst-case voltage.

In another embodiment, a computer readable medium or media comprises computer readable program instructions implementable in a computer system. The program instructions calculate a power supply of each device within a circuit. The program instructions comprise functions for creating a circuit to be controlled and for selecting a first device from a list of devices to add to the circuit. The program instructions further comprise functions for calculating an estimated power supply of the first device using modified nodal analysis of the circuit and functions for determining whether the estimated power supply of the first device is sufficient power for the first device to operate.

The foregoing summary, as well as the following detailed description of certain embodiments of the present invention, will be better understood when read in conjunction with the appended drawings. The figures illustrate diagrams of the functional blocks of various embodiments. The functional blocks are not necessarily indicative of the division between hardware circuitry. Thus, for example, one or more of the functional blocks (e.g., processors or memories) may be implemented in a single piece of hardware (e.g., a general purpose signal processor or a block or random access memory, hard disk, or the like). Similarly, the programs may be stand alone programs, may be incorporated as subroutines in an operating system, may be functions in an installed imaging software package, and the like. It should be understood that the various embodiments are not limited to the arrangements and instrumentality shown in the drawings.

DETAILED DESCRIPTION OF THE INVENTION

Figure 1:
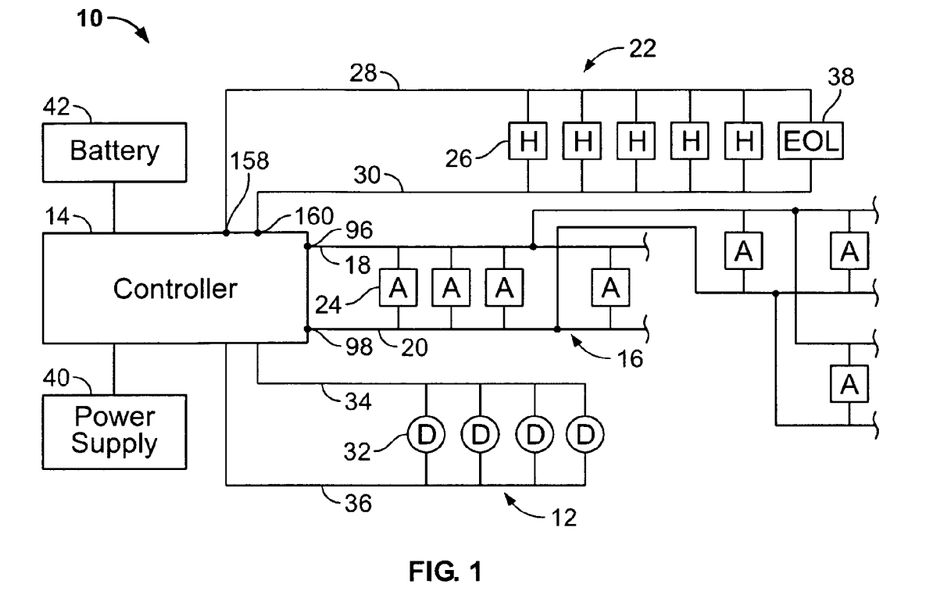
FIG. 1 illustrates an alarm system formed in accordance with an embodiment of the present invention.

FIG. 1 illustrates an alarm system 10 formed in accordance with an embodiment of the present invention. The system 10 includes one or more detector networks 12 having individual alarm condition detectors 32 which are monitored and controlled by a controller 14 or control panel. The detectors 32 may detect fire, smoke, temperature, chemical compositions, or other conditions. The alarm condition detectors 32 are coupled across a pair of power lines 34 and 36. When an alarm condition is sensed, the controller 14 signals the alarm to the appropriate notification devices through one or more networks 16 of addressable notification appliances 24 and/or one or more networks 22 of hardwired (e.g. non-addressable) notification appliances 26. The networks 16 and 22 are also referred to as notification appliance circuits (NAC).

Wiring is used to form the networks 16 and 22. The length of wire, wire size and notification appliance load all vary according to specific requirements for each installation. Each length of wire has unique voltage loss characteristics, making the voltage at the input terminals of each notification appliance 24 and 26 different, with respect to each other, as well as the voltage at the output terminals of the controller 14, even if each notification appliance 24 and 26 on the network 16 and 22 is of the same type. For notification appliances 24 and 26 that are constant power devices, the different voltage levels result in a different current draw for each notification appliance 24 and 26.

The controller 14 is connected to a power supply 40 which provides one or more levels of voltage to the system 10. The power supply 40 may be an AC branch circuit. One or more batteries 42 provide a back-up power source for a predetermined period of time in the event of a failure of the power supply 40 or other incoming power. Other functions of the controller 14 include displaying the status of the system 10 and/or installed component, resetting a part or all of the system 10, silencing signals, turning off strobe lights, and the like.

The addressable notification appliances 24 are coupled to the controller 14 across a pair of lines 18 and 20 that are configured to carry power and communications, such as command instructions. The notification appliances 24 may be wired in a fashion referred to as "T-Tapped". Therefore, multiple branches or spokes may be tapped and run off in different directions, creating multiple lines operating in parallel. Supervision of the notification appliances 24 occurs by polling each notification appliance 24. The notification appliances 24 each have a unique address and both send and receive communications to and from the controller 14.

The hardwired notification appliances 26 are coupled with the controller 14 across a pair of lines 28 and 30. A notification signal sent on the network 22 from the controller 14 will be received by each hardwired notification appliance 26. An end of line (EOL) device 38, such as a resistor, interconnects the ends of the lines 28 and 30 opposite the controller 14.

Each of the notification appliances 24 and 26 is set for one of several output ratings, such as 15 or 110 candela (cd) in the case of strobes, or 85 or 100-decibel in the case of horns. The output rating impacts the current draw of the notification appliance 24 and 26. By way of example only, a notification appliance 24 having a multi-candela strobe may be set to 15 cd. Over a range of input voltages, such as from 16 to 33 VDC, the notification appliance 24 may require approximately 1 watt for operation. Therefore, 1 watt may be assigned as the constant-power rating for the 15 cd strobe. The power required at 110 cd, however, would be different.

Figure 2:
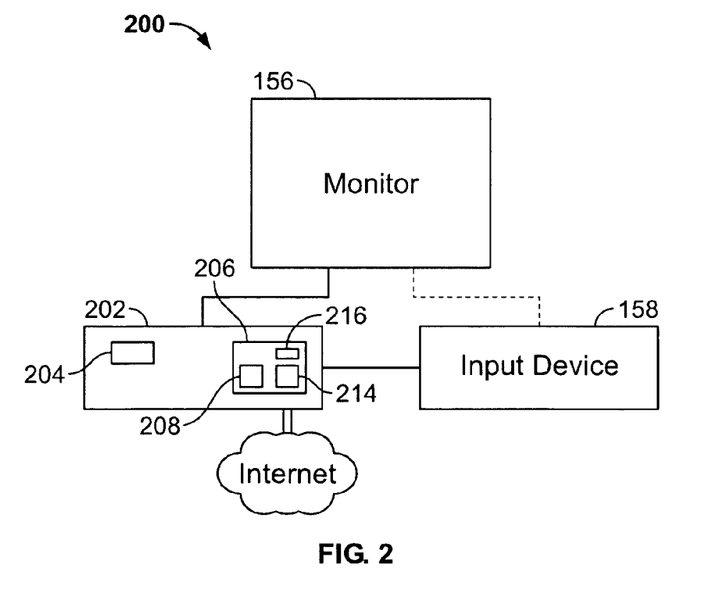
FIG. 2 illustrates a personal computer for performing voltage drop calculations of circuits having appliances and/or other devices installed in accordance with an embodiment of the present invention.

FIG. 2 illustrates a personal computer 200 for performing voltage drop calculations of circuits having appliances and/or other devices installed in accordance with an embodiment of the present invention. The computer 200 comprises a monitor 156 and at least one input device 158, such as a keyboard, mouse, and the like. Alternatively, the monitor 156 may be a touchscreen accepting touch input from the user.

The computer 200 also includes electronics 202 such as a microprocessor 204 and a memory 206. A voltage drop calculator tool 208 may be stored in memory 206 or accessed from any computer readable medium or media. For example, the voltage drop calculator tool 208 may be stored and run from a hard disk drive, mainframe, server, a portable disk such as a CD or DVD, or accessed remotely over the internet. In addition, the voltage drop calculator tool 208 may be easily updated by downloading updates from a website.

The voltage drop calculator tool 208 calculates the voltage drop for circuits such as the alarm system 10 (FIG. 1), displaying a graphical user interface on the monitor 156 which easily allows the user to draw or create an NAC (such as networks 16 and 22), as well as circuits with other devices installed, such as detector network 12. In other words, the voltage drop calculator tool 208 may be used to create circuits having addressable notification appliances 24, non-addressable or hardwired notification appliances 26, as well as other devices used within the alarm system 10. The voltage drop calculator tool 208 uses a Modified Nodal Analysis module 216 to calculate voltage drops using algorithms based on Modified Nodal Analysis. The voltage drop calculator tool 208 automatically performs voltage drop calculations for circuits as notification appliances 24 or 26 or other devices are added, providing real-time feedback on the operability of the designed circuit.

Figure 3:
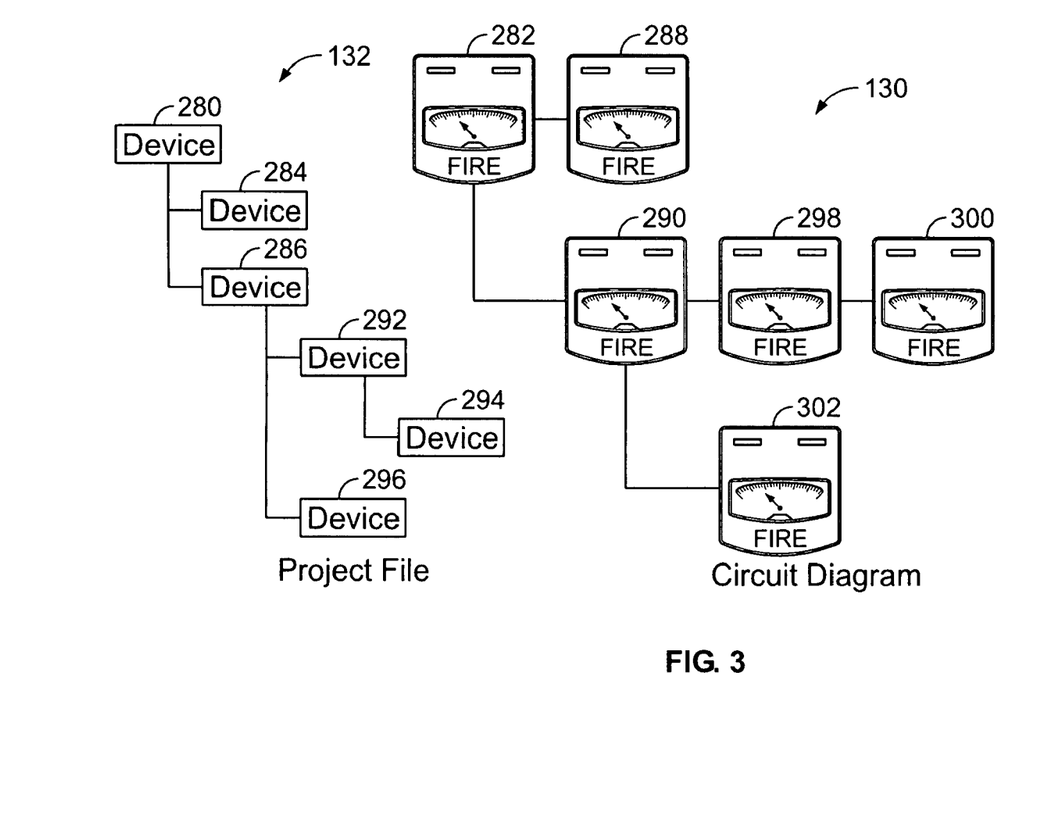
FIG. 3 illustrates a circuit diagram and corresponding project file in accordance with an embodiment of the present invention.

FIG. 3 illustrates a circuit diagram 130 and corresponding project file 132 formed in accordance with an embodiment of the present invention. By way of example, the voltage drop calculator tool 208 may use Extensible Markup Language (XML) format to define the circuit layout and the device properties within the circuit. An XML project file structure is created and stored in memory 206. As each notification appliance 24 and 26 and device (such as detector 32) is added, a Device Node in the XML project file 132 representing the appliance or device is created. For example, Device Node 280 represents appliance 282. Sibling Device Nodes 284 and 286 represent appliances 288 and 290, respectively, on multiple branches, while Child Device Nodes 292, 294 and 296 represent appliances 298, 300 and 302, respectively, on the same branch. It should be understood that other formats and languages other than XML may be used to provide the program instructions, modules and functions needed.

Figure 4:
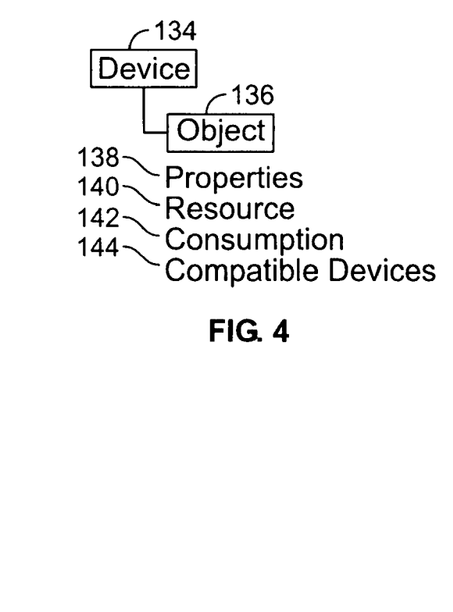
FIG. 4 illustrates a Device Node in accordance with an embodiment of the present invention.

FIG. 4 illustrates a Device Node 134 in accordance with an embodiment of the present invention. Each Device Node 134 has an Object Node 136 comprising a Properties Node 138, Resources Node 140, Consumption Node 142 and a Compatible Devices List Node 144. The Properties Node 138 defines the appliance circuit characteristics, such as whether the device is resistive or a constant power load. The Resources Node 140 defines the resources available on the device, such as addressable point capacity and device load capacity. The Consumption Node 142 defines what the device consumes, such as the required device loads, addressable points, and the like. The Compatible Devices List Node 144 provides a list of devices which may be attached to the device represented by the Device Node 134. Therefore, the Object Node 136 of each Device Node 134 defines the next possible Device Node. It should be understood that other Nodes may be included in the Object Node 136, providing additional information, performance characteristics, and circuit defining rules.

Figure 5:
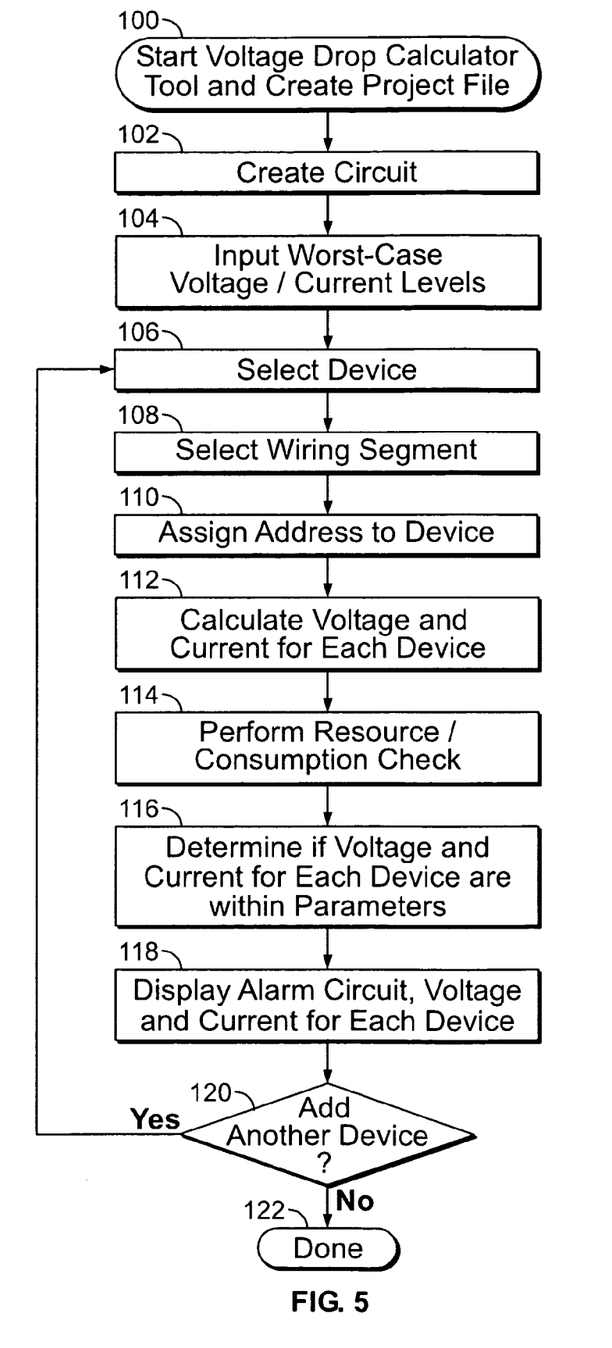
FIG. 5 illustrates a method for designing an alarm system using the voltage drop calculator tool in accordance with an embodiment of the present invention.

FIG. 5 illustrates a method for designing an alarm system 10 using the voltage drop calculator tool 208 in accordance with an embodiment of the present invention. The voltage drop calculator tool 208 provides the user real-time feedback as circuits are created, allowing the user to maximize the capabilities of devices. This provides greater efficiency within the installed system, as the wiring runs and device loads are not limited by calculations based on the lump sum method. The voltage drop calculator tool 208 also simplifies the work of the user, as calculations are performed automatically and circuit design rules are integrated into the voltage drop calculator tool 208.

Prior to running the voltage drop calculator tool 208, the user identifies which devices and appliances are desired and where each is to be located within the building. The user may reference blueprints and other floor plans or drawings to place the devices and determine how long a wiring run is from one device to the next.

In step 100, the user starts or launches the voltage drop calculator tool 208 and creates an alarm system project file. The project file may be similar to that of the project file 132 in FIG. 3, and may be stored in memory 206. The project file 132 is continuously updated, defining the circuit and how devices are connected to each other, as well as storing other information about the circuit and devices.

In step 102, the user selects one or more desired controllers from a displayed list of controllers and creates one or more circuits, such as SLCs. Each circuit is controlled by one of the controllers, and each controller may control multiple circuits. In step 104, the user inputs the worst-case voltage and/or current levels. The voltage drop calculator tool 208 displays a device list on the monitor 156, and in step 106, the user selects a device from the device list. Then, in step 108, the user is prompted to select a wiring segment from a displayed wire selection box. The wiring segment defines the wire size and length interconnecting two nodes in the circuit, as well as allowing the user to add multiple devices (nodes) at one time in a T-Tapped configuration.

The voltage drop calculator tool 208 assigns an address to the first device 164 in step 110, and in step 112, calculates the estimated power supply, the voltage and current, for each device on the circuit using the equations in the Modified Nodal Analysis module 216. In step 114, the voltage drop calculator tool 208 performs a resource/consumption check to verify that controller resources exist to support the added device(s).

In step 116, the voltage drop calculator tool 208 determines if the voltage and current for each device on the alarm circuit 150 are within allowable limits, and in step 118, displays the device(s) and wiring segment(s) on the monitor 156. The voltage and current for each device is also displayed, as well as an indication of whether each parameter is within the allowable limits. Other parameters may also be displayed, such as power consumption. In step 120, the method returns to step 106 to add another device or terminates in step 122.

Figure 6:
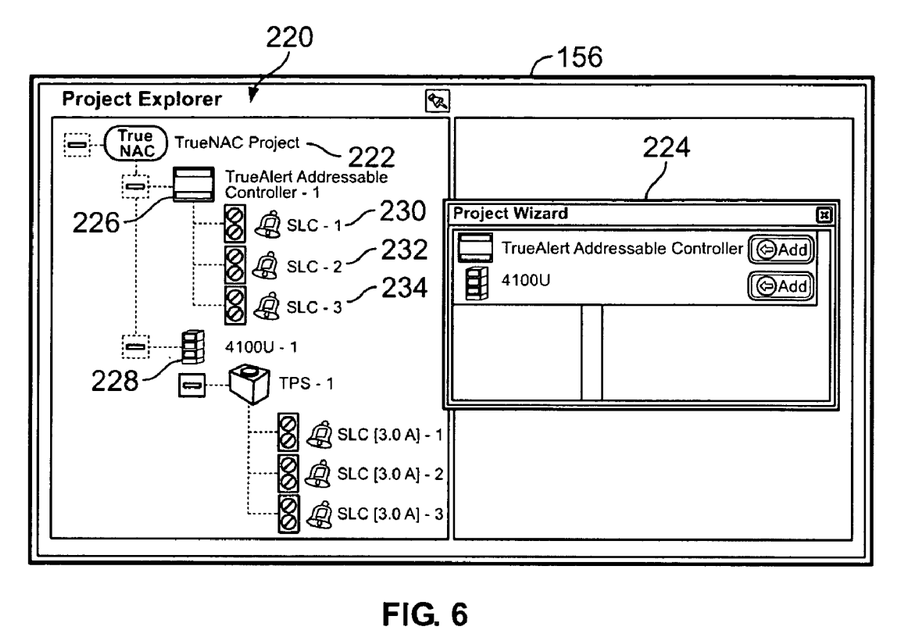
FIG. 6 illustrates a graphical user interface displaying a system project on the monitor in accordance with an embodiment of the present invention.

FIG. 6 illustrates a graphical user interface displaying a system project on the monitor 156 in accordance with an embodiment of the present invention. A Project Explorer window 220 is displayed. The voltage drop calculator tool 208 may provide a project wizard function which leads a user through creating or building the system project.

The system project has been assigned a title 222 of TrueNAC project by the user. The user selects one or more controller (step 100), such as the controller 14 (FIG. 1), using selection window 224. The Project Explorer window 220 displays a first controller 226 and an integrated universal controller 228.

The user creates one or more circuits (step 102). For example, the user adds first, second and third signaling line circuits (SLCs) 230, 232 and 234 (FIG. 6), which will be controlled by the first controller 226. For example, a SLC may be a T-Tapped circuit or single line circuit, having addressable notification appliances 24 installed. It should be understood that notification circuits, such as network 22 (FIG. 1), or detector networks 12 may also be created, using the voltage drop calculator tool 208 to calculate the voltage drop for circuits with other types of powered devices.

The number of SLCs and/or devices which may be connected to the first controller 226 may be limited by regulatory bodies or by the capability of the first controller 226. Referring again to FIG. 4, parameters specific to each device are stored by the voltage drop calculator tool 208. Therefore, the voltage drop calculator tool 208 applies the parameters and the regulatory rules, guiding the user to build an alarm system 10 which meets regulatory standards and operates properly.

Figure 7:
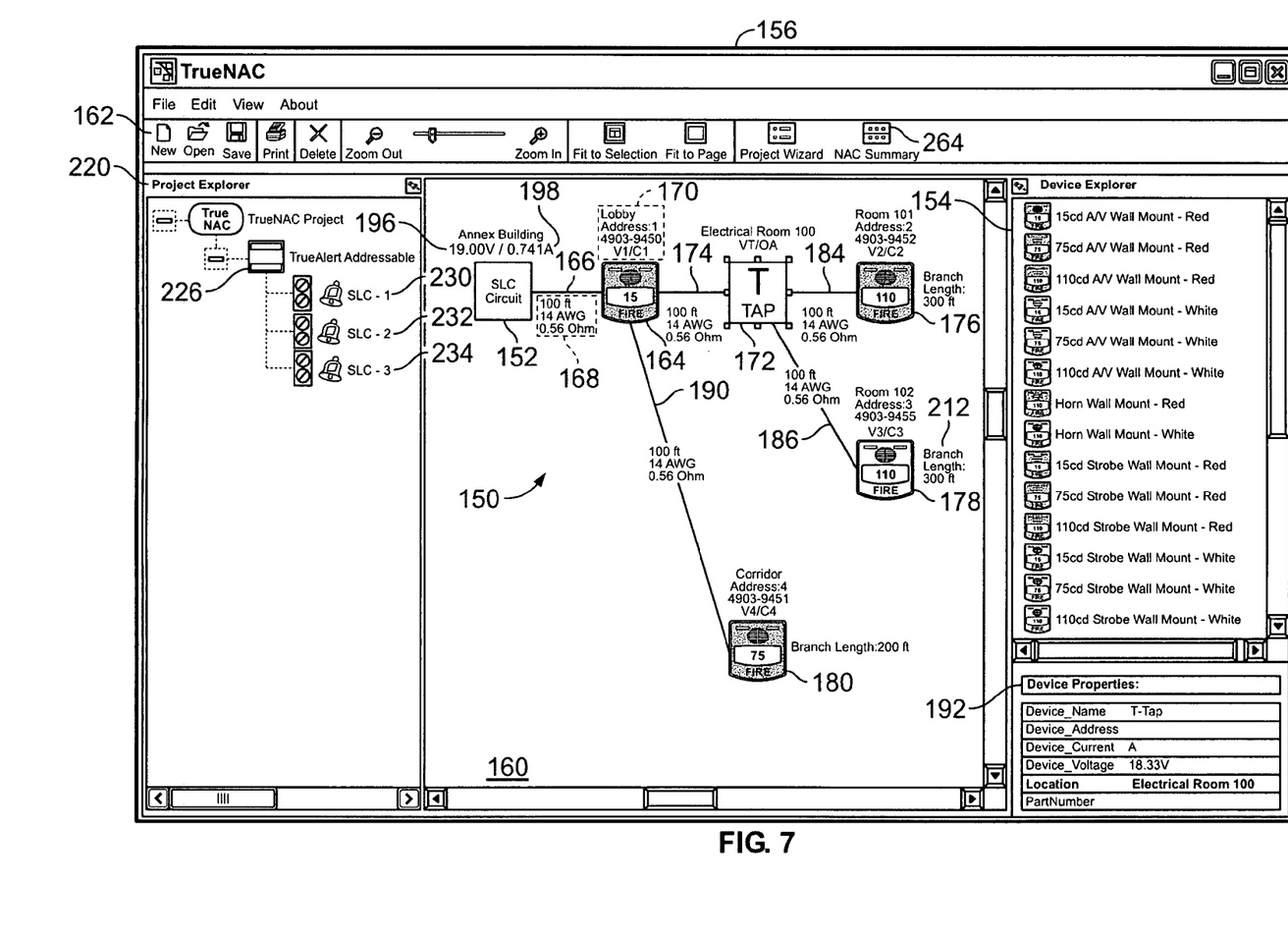
FIG. 7 illustrates an alarm circuit created using the voltage drop calculator tool in accordance with an embodiment of the present invention.

FIG. 7 illustrates an alarm circuit 150 created using the voltage drop calculator tool 208 in accordance with an embodiment of the present invention. The Project Explorer window 220 is displayed with the first controller 226 and the first, second and third SLCs 230, 232 and 234. The first SLC 230 is selected, and thus the alarm circuit 150 displayed in circuit build window 160 is associated with the first SLC 230.

An SLC circuit icon 152, corresponding to the selected SLC 230, is displayed in the circuit build window 160. The user inputs the worst-case voltage and/or current levels (step 104). For example, the worst-case voltage level may be 85% of the rated input voltage. Worst-case voltage 196 and worst-case current 198 may be displayed within the circuit build window 160 proximate the SLC circuit icon 152. A device list 154 and device properties window 192 are also displayed. A toolbar 162 displays icons allowing the user to easily select various functions and modify the display.

The user selects a device from the device list 154 (step 106). The device list 154 may represent a list or database of devices which may be stored in a library 214 (FIG. 2) in memory 206. The library 214 stores information associated with notification appliances 24 and 26, detectors 32 and EOL device 38, as well as any other appliance and device which may be added to the alarm circuit 150. For example, the library 214 may store device identification, power consumption, vender or manufacturer, part number and other information. Users may add additional devices to the library 214, modify device information, and/or download updated and new device information over the internet.

Figure 8:
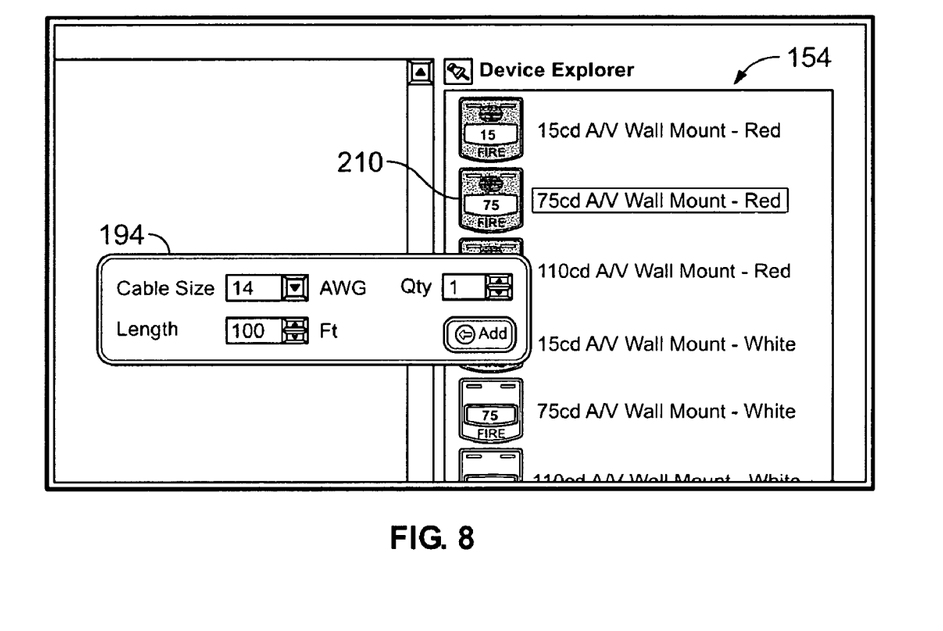
FIG. 8 illustrates the selection of a device using the voltage drop calculator tool in accordance with an embodiment of the present invention.

FIG. 8 illustrates the selection of a device using the voltage drop calculator tool 208 in accordance with an embodiment of the present invention. A portion of the device list 154 is illustrated. The user may select device 210 using the input device 158. The device 210 is then highlighted on the monitor 158.

After the device 210 is selected, the voltage drop calculator tool 208 displays a wire selection box 194 and the user selects a wiring segment (step 108). The wire selection box 194 allows the user to specify cable size, length, and number of segments. In one embodiment, the cable size and length may be standard, based on cable devices available on the device list 154 and/or stored in the library 214. The size and length may be displayed in other formats, such as meters instead of feet. In FIG. 8, the user selects a quantity of one wiring segment, and first device 164 and wiring segment 166 are defined. If desired, multiple devices may be added to the alarm circuit 150 at the same time by selecting multiple segments. For example, to create two branches (sibling devices) depending from the currently selected location, the user inputs two into the quantity (Qty) selection box.

The voltage drop calculator tool 208 then assigns an address to the first device 164 (step 110) and calculates the estimated power supplied or the voltage and current for each device on the alarm circuit 150 using the equations in the Modified Nodal Analysis module 216 (step 112). The Modified Nodal Analysis equations used to compute the voltage drops and current are discussed further below. The voltage drop calculator tool 208 performs a resource/consumption check (step 114) to verify that controller resources exist to support the device(s) to be added.

Figure 9:
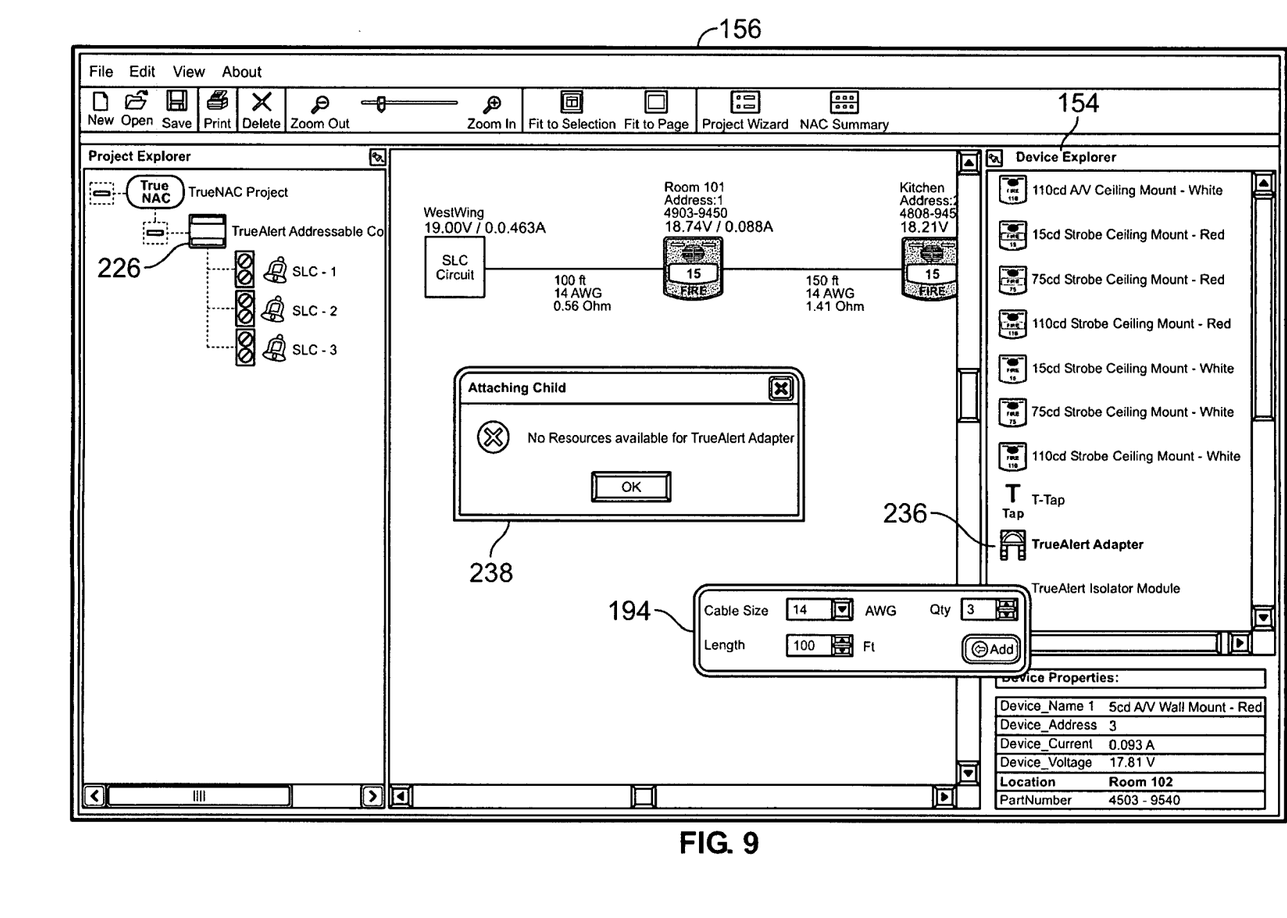
FIG. 9 illustrates an example of when a user has selected devices exceeding the resources of the first controller in accordance with an embodiment of the present invention.

FIG. 9 illustrates an example of when a user has selected devices exceeding the resources of the first controller 226 in accordance with an embodiment of the present invention. The user selects TrueAlert Adapter device 236 from the device list 154 to be added to the alarm circuit 150. The user selects the desired cable size, length and a quantity of three from the wire selection box 194. The voltage drop calculator tool 208 displays an error window 238 to inform the user that resources are not available to add the devices. The first controller 226 or other controller 14 may have a maximum number of addresses and/or device loads it can support. Also, regulations and circuit layout rules may limit the number of devices and/or the way the devices are interconnected. For example, the first controller 226 may support up to 63 addresses and 75 devices loads. An example of layout rules may include limitations such as connecting a maximum of twelve isolators in one circuit, connecting a maximum of six isolators directly to one another, and connecting up to two addressable adapter modules to a circuit. The voltage drop calculator tool 208 automatically ensures that resource limitations and rules are followed. It is not necessary for the user to track the number of devices being used on a single circuit, the total consumption of the devices, or to make sure that applicable layout rules are followed.

The voltage drop calculator tool 208 determines if the voltage and current for each device on the alarm circuit 150 are within allowable limits (step 116). The voltage and current for each device may be compared to values stored in the Consumption Node 142 (FIG. 4) to determine if the voltage and current available at the device are sufficient for proper operation. For example, a low voltage limit may be stored which defines a minimum operating voltage, below which the device may not operate properly.

The first device 164 (FIG. 7) and wiring segment 166 are then displayed in the circuit build window 160 (step 118). The assigned address (step 110) is displayed in identifying information 170 proximate the first device 164, as well as the part number of the first device 164, voltage V1 and current C1. Other parameters may be displayed. The user may enter a Location in the device properties window 192 corresponding to the installation location within the building. Wiring parameters 168 are also displayed.

Figure 10:
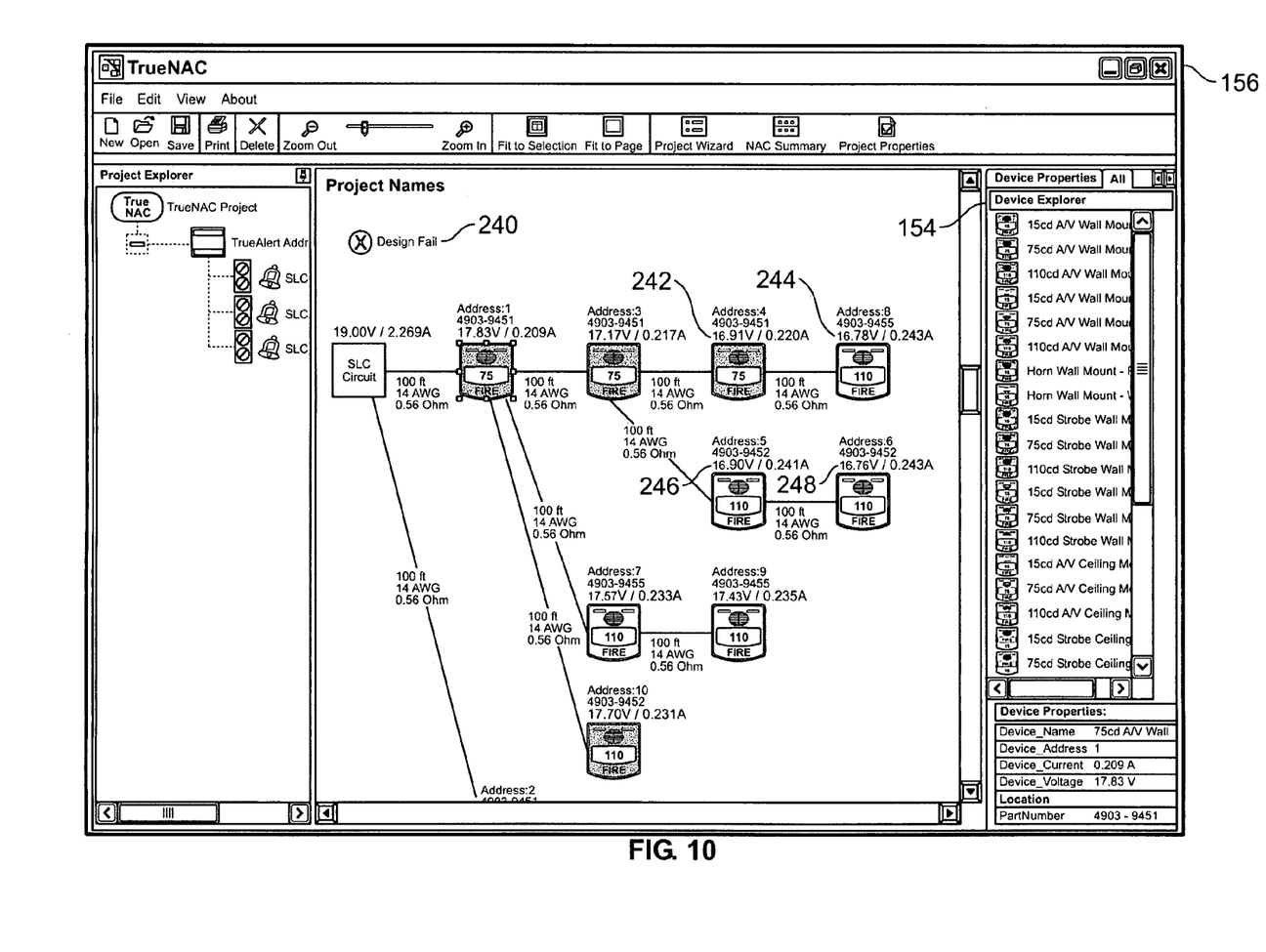
FIG. 10 illustrates an example of when one or more devices exceed the voltage and/or current limits in accordance with an embodiment of the present invention.

FIG. 10 illustrates an example of when one or more devices exceed the voltage and/or current limits in accordance with an embodiment of the present invention. If the voltage and/or current are within allowable limits, the parameters may be displayed using predefined colors, such as green for voltage and blue for current. If the voltage and/or current values of any device fail the comparison of step 116, the failing parameter may be displayed in a different color, such as red. For example, voltages 242, 244, 246 and 248 may be displayed in red, indicating a failure condition. Alternatively, the failing parameter may be displayed in a color other than red, in a different font or size, flashing, or other display option to communicate the failure to the user. In addition, as error message 240 may be displayed, alerting the user that the current design has failed.

If another device is to be added to the alarm circuit 150 (step 120), the user selects the next device from the device list 154 (step 106). For ease of use, the voltage drop calculator tool 208 may automatically select the previously added device, in this case the first device 164, to build from. The selected device in the alarm circuit 150 is displayed in the device properties window 192. The voltage drop calculator tool 208 is interactive, allowing the user to select a different device upon which to further build the circuit. In this manner, the user can easily move between branches and circuits.

Optionally, the voltage drop calculator tool 208 may allow the user to select only allowed devices in the device list 154. For example, the voltage drop calculator tool 208 may track and evaluate the Compatible Devices List Node 144 of the currently selected device, the circuit layout rules, and available capacity of the circuit and first controller 226. Disallowed devices may not be displayed or be displayed in a grayed format, for example. Therefore, the user is only allowed to select devices which will work within the alarm circuit 150. Alternatively, the user may be allowed to override the voltage drop calculator tool 208, selecting devices and/or quantities of devices which will cause the alarm circuit 150 to fail. This may be advantageous if the user wishes to add all desired devices and then modify the design to determine the optimal installation.

Returning to FIG. 7, T-Tap device 172 is selected (step 106) and the user selects wiring segment 174 (step 108). The voltage drop calculator tool 208 may not assign an address to the T-Tap device 172 (step 110) or other non-communicating devices. The voltage drop calculator tool 208 calculates the voltage and current available at each device on the alarm circuit 150 (step 112). Therefore, the calculations are based on all devices (the first device 164 and the T-Tap device 172) and all wiring segments (the wiring segments 166 and 174). The voltage drop calculator tool 208 performs the resource/consumption check (step 114) and verifies the voltage and current levels (step 116). The voltage drop calculator tool 208 displays the T-Tap device 172 connected to the first device 164 by way of wiring segment 174. The voltage and current are updated and displayed for each device.

As devices are added, the voltage and current calculated and displayed for a particular device will change. Therefore, the voltage drop calculator tool 208 provides updated real-time calculations to the user, allowing the user to modify the alarm circuit 150 by adding and deleting devices based on the actual capacity available.

Referring again to the alarm circuit 150 in FIG. 7, the user selects another device from the device list 154 (step 106). The voltage drop calculator tool 208 displays the wire selection box 194 and the user selects the cable size, length and a quantity of two (step 108). The voltage drop calculator tool 208 defines two devices, second and third devices 176 and 178, both connected to the T-Tap device 172 with wiring segments 184 and 186, respectively. Therefore, the voltage drop calculator tool 208 allows the user to easily add multiple devices at one time in the T-Tapped configuration.

The voltage drop calculator tool 208 assigns an address to each added device (step 110) and calculates the voltage and current supplied to each device on the alarm circuit 150 (step 112). As discussed previously, the voltage and current levels previously calculated and displayed may change based on the added devices and wiring segments. The voltage drop calculator tool 208 performs the resource/consumption check (step 114) and verifies that the voltage and current are within defined parameters (step 116).

The voltage drop calculator tool 208 displays the alarm circuit 150, adding the second and third devices 176 and 178 and the wiring segments 184 and 186. The voltage and current values for each device on the alarm circuit 150 are displayed and/or updated, such that V1 and C1 of the first device 164 and VT of the T-Tap device 172 may change from their previous values.

In a similar manner, fourth device 180 is added, connecting to the first device 164 by way of wiring segment 190. The voltage and current levels within the alarm circuit 150 are recalculated and displayed.

Optionally, the voltage drop calculator tool 208 may calculate and display branch length 212 for each branch. The branch length 212 is the distance from the beginning of the SLC circuit, the controller 226, to the end of the branch. For example, the branch length 212 from the controller 226 to the third device 178 is calculated based on the distance of each of the wiring segments 166, 174, and 186.

As stated previously, the Modified Nodal Analysis module 216 in the voltage drop calculator tool 208 uses Modified Nodal Analysis to calculate voltage drops within a circuit having devices and/or appliances installed on one or multiple branches. Each time the voltage drops are calculated (step 112), the number of independent voltage sources, dependent current sources and number of nodes (devices) are identified. Kirchoff's current law is then applied to each node resulting in node equations. The node equations result in the following matrix equation:

$$Ax = z \qquad \text{Equation 1}$$

The x matrix holds the unknown voltage values and the current values for the constant power appliances. Multiplying the z matrix with the inverse A matrix results in the x matrix:

$$x = zA^{-1} \qquad \text{Equation 2}$$

Figure 11:
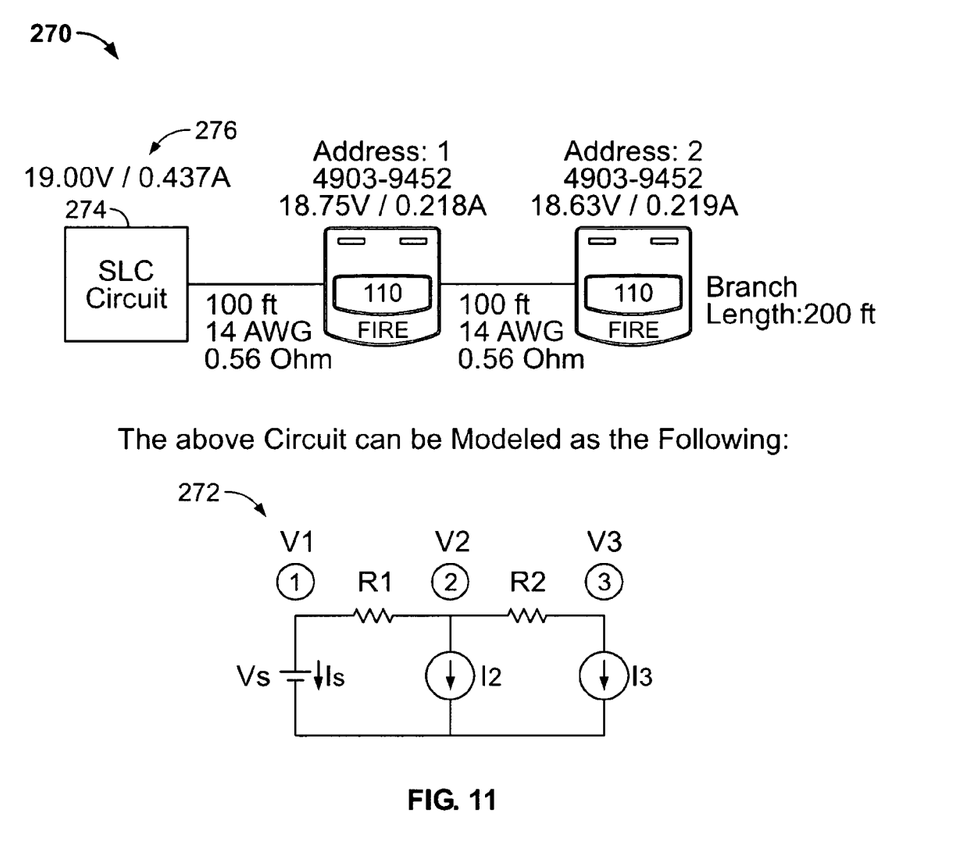
FIG. 11 illustrates a signaling line circuit (SLC) and a corresponding circuit diagram in accordance with an embodiment of the present invention.

FIG. 11 illustrates an SLC 270 and a corresponding circuit diagram 272 in accordance with an embodiment of the present invention. The SLC 270 comprises an SLC circuit icon 274, indicating the worst-case voltage and current 276. The circuit diagram 272 is a model of the SLC 270.

Figure 12:
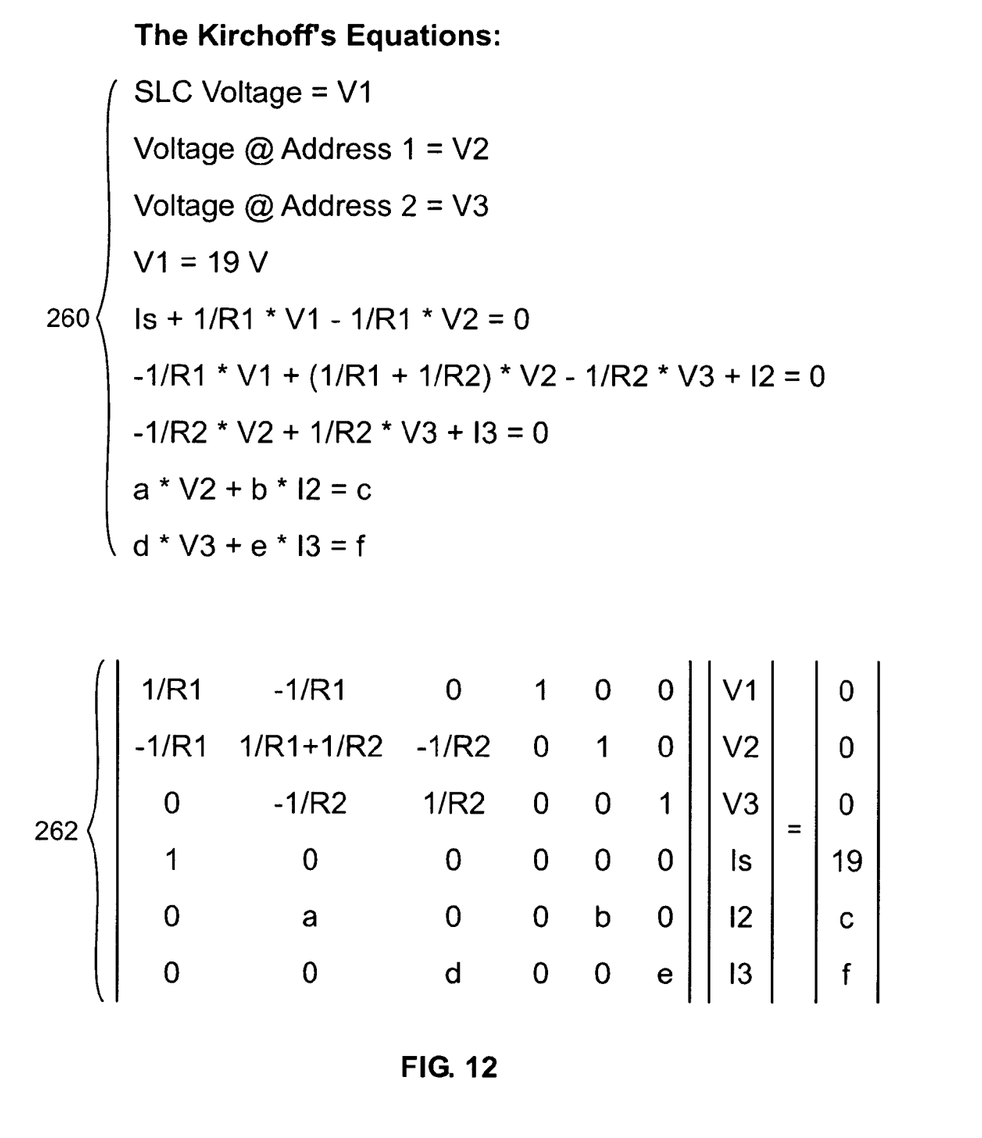
FIG. 12 illustrates a set of equations used by the voltage drop calculator tool to calculate the voltage drops in accordance with an embodiment of the present invention.

FIG. 12 illustrates a set of equations 260 used by the voltage drop calculator tool 208 to calculate the voltage drops in accordance with an embodiment of the present invention. The corresponding Modified Nodal Analysis matrix 262 is also illustrated. Alternatively, the set of equations 260 of the voltage drop calculator tool 208 may be implemented via a spreadsheet or software tool, such as MathCAD. However, the user may have to manually enter more data when using a different graphical user interface.

Figure 13:
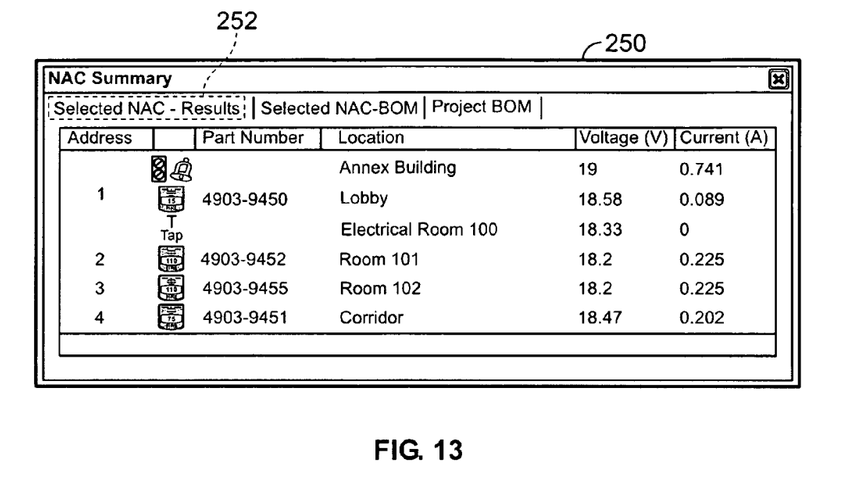
FIG. 13 illustrates a notification appliance circuit (NAC) summary window in accordance with an embodiment of the present invention.

FIG. 13 illustrates an NAC summary window 250 in accordance with an embodiment of the present invention. The summary window 250 may be displayed by selecting an NAC summary icon 264 (FIG. 7) using the input device 158 (FIG. 2). When Selected NAC—Results tab 252 is selected, the voltage drop calculator tool 208 displays the information for the currently selected SLC in the alarm circuit 150 in table format. Therefore, detailed information for each SLC in the alarm circuit 150 may be displayed separately. The voltage and current for each device is displayed, and the user may enter or change the address and location for any displayed device.

Figure 14:
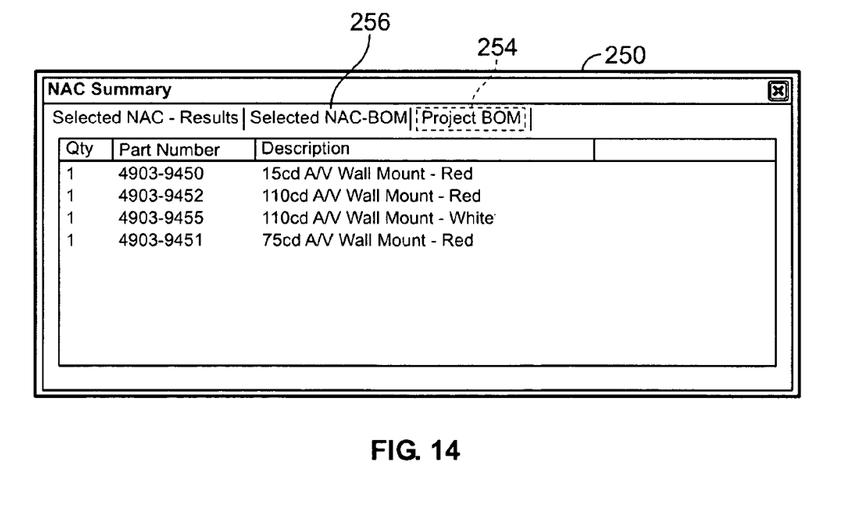
FIG. 14 illustrates the NAC summary window with Project Bill of Materials (BOM) tab selected in accordance with an embodiment of the present invention.

FIG. 14 illustrates the NAC summary window 250 with Project Bill of Materials (BOM) tab 254 selected in accordance with an embodiment of the present invention. The quantity, part number and description are displayed in table format for each device used in the project, allowing for easy planning, pricing, and ordering of materials needed for the project. Although not illustrated, a Selected NAC—BOM tab 256 displays the quantity, part number and description for each device used on the particular selected SLC in similar format to the Project BOM tab 254.

The graphical circuit layout and summary reports available from the summary window 250 provide information for project submittals which are quickly and easily prepared. The circuit diagram illustrates the selected circuit in a visual format, while the summary report provides tabulated results.

The interactive design of the voltage drop calculator tool 208 allows the user to return to circuits to add and delete devices as needed. The voltage drop calculator tool 208 also may allow the user to drag and drop devices from one branch to another and from one SLC to another. Circuit changes which result from building design or construction changes can easily be modeled prior to physically installing the modified circuit. The voltage drop calculator tool 208 maximizes the system resources, and thus minimizes cost. Additional safeguards are provided by automatically performing the calculations, tracking circuit design and functionality, and providing real-time feedback to the user.

While the invention has been described in terms of various specific embodiments, those skilled in the art will recognize that the invention can be practiced with modification within the spirit and scope of the claims.

What is claimed is:

1. A method for performing voltage drop calculations in an alarm circuit, comprising:
    creating a circuit to be controlled;
    displaying, on a graphical user interface, a graphical circuit layout based on the circuit created;
    selecting, through the graphical user interface, a first device from a list of devices to add to the circuit;
    calculating an estimated power supplied to the first device using modified nodal analysis of the circuit; and
    determining whether the estimated power supplied to the first device is sufficient power for the first device to operate.

2. The method of claim 1, further comprising:
    selecting a second device from the list of devices to add to the circuit; and verifying that the second device is on a list of compatible devices associated with the first device.

3. The method of claim 1, further comprising:
identifying a device load limit of a controller used to control the circuit, the device load limit comprising at least one of a maximum number of addresses and a maximum number of device loads; and
determining whether the circuit comprises a device load within the device load limit.

4. The method of claim 1, further comprising selecting second and third devices from the list of devices to add to the circuit in a T-Tapped configuration, the calculating step further comprising calculating estimated second and third power supplies to the second and third devices and recalculating the estimated power supplied to the first device.

5. The method of claim 1, further comprising displaying the circuit on a monitor and indicating a pass or fail condition for the first device, the pass condition indicating that the estimated power supplied to the first device is sufficient for the first device to operate, the fail condition indicating that the estimated power supplied to the first device is not sufficient for the first device to operate.

6. A method for performing voltage drop calculations in an alarm circuit, comprising:
creating a circuit to be controlled;
selecting a first device from a list of devices to add to the circuit;
calculating an estimated power supplied to the first device using modified nodal analysis of the circuit; and
determining whether the estimated power supplied to the first device is sufficient power for the first device to operate, further comprising selecting a second device from the list of devices to add to the circuit, the calculating step further comprising calculating a second estimated power supplied to the second device and recalculating the estimated power supplied to the first device.

7. A method for performing voltage drop calculations in an alarm circuit, comprising:
creating a circuit to be controlled;
selecting a first device from a list of devices to add to the circuit;
calculating an estimated power supplied to the first device using modified nodal analysis of the circuit; and
determining whether the estimated power supplied to the first device is sufficient power for the first device to operate, the calculating step further comprising calculating a voltage level of the first device, the determining step further comprising comparing the voltage level to a low voltage limit defining a minimum operating voltage of the first device to determine whether the voltage level is within allowable limits.

8. A graphical interface tool for calculating voltage drop in a circuit, comprising:
a display displaying a graphical user interface (GUI) allowing a user to create a circuit layout representing a circuit to be controlled;
the GUI permitting. the user to select a controller to add to the circuit layout the controller being used to control the circuit, the controller receiving power from a power source, the controller having a worst-case voltage based on the power source;
the GUI permitting the user to select a first device from a list of devices displayed on the display to add to the circuit layout; and
a processor calculating a first voltage of the first device based on the worst-case voltage of the controller.

9. The tool of claim 8, the processor using modified nodal analysis to calculate the first voltage of the first device.

10. The tool of claim 8, the display displaying the circuit layout as a graphical circuit layout.

11. The tool of claim 8, the display displaying the circuit layout in a table format.

12. The tool of claim 8, the processor determining whether the first voltage of the first device is sufficient for the first device to operate and the display displaying a pass or fail condition based on the determining operation.

13. The tool of claim 8, wherein the GUI permits the user to enter at least one voltage level provided by the power supply.

14. The tool of claim 8, wherein the GUI permits the user to enter individual wire lengths associated with each device in the circuit layout created.

15. The tool of claim 8, wherein the GUI provides real-time feedback regarding voltage drops for at least one device as the circuit layout is created and revised.

16. A computer readable medium or media comprising computer readable program instructions, which when executed by a computer system causes the computer system to calculate, a power supply of each device within a circuits comprising:
instructions for implementing a graphical user interface (GUI) allowing a user to create a circuit layout representing a circuit to be controlled;
instructions for controlling the GUI to permit the user to select a first device from a list of devices to add to the: circuit layout;
instructions for calculating an estimated power supplied to the first device using modified nodal analysis of the circuit; and
instructions for determining whether the estimated power supplied to the first device is sufficient power for the first device to operate.

17. The computer readable medium of claim 16, the circuit further comprising nodes interconnected with one another, the program instructions further comprising instructions to define the nodes in the circuit.

18. The computer readable medium of claim 16, the program instructions further comprising instructions for defining a list of compatible devices attachable to the circuit.

19. The computer readable medium of claim 16, the program instructions further comprising instructions to define nodes within the circuit and means for defining a subsequent node based on a previous node.

20. The computer readable medium of claim 16, further comprising means for displaying a failure status on a monitor when the first device is receiving insufficient power for operation.

21. The computer readable medium of claim 16, the circuit further comprising interconnected nodes, each of the nodes representing a device, the program instructions further comprising instructions directing the computer system to automatically recalculate the power supplied to the devices when the circuit is revised.

* * * * *